(12) United States Patent
Meng et al.

(10) Patent No.: US 12,225,775 B2
(45) Date of Patent: Feb. 11, 2025

(54) ARRAY SUBSTRATE AND FABRICATION METHOD THEREOF, DISPLAY PANEL (71) Applicant: BOE TECHNOLOGY GROUP CO., LTD., Beijing (CN)

(72) Inventors: Qiuhua Meng, Beijing (CN); Ming Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 492 days.

(21) Appl. No.: 17/531,984

(22) Filed: Nov. 22, 2021

(65) Prior Publication Data

US 2022/0285466 A1 Sep. 8, 2022

(30) Foreign Application Priority Data

Mar. 8, 2021 (CN) ......................... 202110251698.4

(51) Int. Cl.
*H10K 59/122* (2023.01)
*H10K 50/818* (2023.01)
(Continued)

(52) U.S. Cl.
CPC ......... *H10K 59/122* (2023.02); *H10K 50/818* (2023.02); *H10K 50/828* (2023.02);
(Continued)

(58) Field of Classification Search
CPC ......... H10K 59/80518; H10K 59/8792; H10K 59/38
See application file for complete search history.

(56) References Cited

U.S. PATENT DOCUMENTS

2003/0227021 A1* 12/2003 Yamazaki ............ H10K 59/878
438/22
2007/0267973 A1* 11/2007 Suh ........................ H10K 50/82
313/506
(Continued)

FOREIGN PATENT DOCUMENTS

CN 108493230 A 9/2018
KR 20060001749 A 1/2006
(Continued)

OTHER PUBLICATIONS

China Patent Office, CN202110251698.4 First Office Action issued on Apr. 8, 2022.
(Continued)

*Primary Examiner* — Evan G Clinton
(74) *Attorney, Agent, or Firm* — HOUTTEMAN LAW LLC (57) ABSTRACT

Provided are an array substrate, a fabrication method thereof, and a display panel. The array substrate includes a substrate; a reflective electrode layer on the substrate; a pixel defining layer on a side of the reflective electrode layer away from the substrate; an anti-reflection layer between the reflective electrode layer and the pixel defining layer, and configured to absorb light from outside, an orthographic projection of the anti-reflection layer on the substrate being within an overlapping portion between the orthographic projection of the reflective electrode layer on the substrate and the orthographic projection of the pixel defining layer on the substrate; and a black matrix on a side of the pixel defining layer away from the substrate, an orthographic projection of at least a portion of the anti-reflection layer on the substrate not overlapping with an orthographic projection of the black matrix on the substrate.

19 Claims, 4 Drawing Sheets

(51) Int. Cl.
  *H10K 50/828* (2023.01)
  *H10K 50/86* (2023.01)
  *H10K 59/38* (2023.01)
  *H10K 71/00* (2023.01)
  *H10K 59/12* (2023.01)
  *H10K 102/00* (2023.01)

(52) U.S. Cl.
  CPC ........... *H10K 50/86* (2023.02); *H10K 50/865* (2023.02); *H10K 59/38* (2023.02); *H10K 71/00* (2023.02); H10K 59/1201 (2023.02); H10K 2102/3026 (2023.02)

(56) References Cited

U.S. PATENT DOCUMENTS

2010/0285630 A1    11/2010    Lee
2021/0343811 A1 *    11/2021    Kim ..................... H10K 59/124

FOREIGN PATENT DOCUMENTS

WO    WO-2013047622 A1 *    4/2013    ........... H01L 27/322
WO    WO-2020020224 A1 *    1/2020    ............... G02B 1/11

OTHER PUBLICATIONS

China Patent Office, CN202110251698.4 Second Office Action issued on Sep. 7, 2022.

* cited by examiner

ARRAY SUBSTRATE AND FABRICATION METHOD THEREOF, DISPLAY PANEL

CROSS-REFERENCE TO RELATED APPLICATION

This application claims the benefit of priority to Chinese Patent Application No. 202110251698.4 filed on Mar. 8, 2021, the contents of which are incorporated herein in their entirety by reference.

TECHNICAL FIELD

The present disclosure belongs to the field of display technology, and particularly relates to an array substrate, a fabrication method thereof, and a display panel.

BACKGROUND

The organic light emitting diode (OLED) display apparatuses are self-emissive devices, and do not require backlights. OLED display apparatuses also provide more vivid colors and a larger color gamut as compared to the conventional liquid crystal display (LCD) apparatuses. Further, OLED display apparatuses can be made more flexible, thinner, and lighter than a typical LCD.

The purpose of introducing the polarizer into the LED screen body structure is to eliminate the reflection of the screen body to ambient light to the maximum extent, thereby improving the display effect. However, the filtering effect of the polarizer causes a great attenuation in the brightness of the screen body, resulting in an increase in the energy consumption of the screen body. Currently, the technology for replacing the polarizer is low temperature color filter patterned on TFE (COE).

SUMMARY

The present disclosure provides an array substrate, including:
a substrate;
a reflective electrode layer on the substrate;
a pixel defining layer on a side of the reflective electrode layer away from the substrate, wherein an orthographic projection of the reflective electrode layer on the substrate overlaps with an orthographic projection of the pixel defining layer on the substrate;
an anti-reflection layer between the reflective electrode layer and the pixel defining layer, and configured to absorb light from outside, wherein an orthographic projection of the anti-reflection layer on the substrate is within an overlapping portion between the orthographic projection of the reflective electrode layer on the substrate and the orthographic projection of the pixel defining layer on the substrate; and
a black matrix on a side of the pixel defining layer away from the substrate, wherein an orthographic projection of at least a portion of the anti-reflection layer on the substrate does not overlap with an orthographic projection of the black matrix on the substrate.

In an embodiment of the present disclosure, the orthographic projection of the anti-reflection layer on the substrate adjoins the orthographic projection of the black matrix on the substrate.

In an embodiment of the present disclosure, the orthographic projection of the anti-reflection layer on the substrate partially overlaps with the orthographic projection of the black matrix on the substrate.

In an embodiment of the present disclosure, an orthographic projection of at least one edge of the anti-reflection layer on the substrate coincides with an orthographic projection of an edge of the pixel defining layer on the substrate.

In an embodiment of the present disclosure, a material of the anti-reflection layer includes a black metal oxide.

In an embodiment of the present disclosure, the black metal oxide is tungsten oxide ($WO_x$) or molybdenum oxide ($MoO_x$).

In an embodiment of the present disclosure, a material of the reflective electrode layer includes any one of silver or aluminum.

In an embodiment of the present disclosure, the array substrate further includes a display structure and a color filter layer on a side of the display structure away from the substrate. The display structure includes: the reflective electrode layer; a light emitting layer on a side of the reflective electrode layer and the pixel defining layer away from the substrate; and a transparent electrode layer on a side of the light emitting layer away from the substrate. The color filter layer includes: the black matrix; and a color filter in an area defined by the black matrix.

In an embodiment of the present disclosure, the array substrate further includes a first protective layer between the reflective electrode layer and the light emitting layer.

In an embodiment of the present disclosure, the first protective layer and the anti-reflection layer are formed from a same black metal oxide layer, and a light transmittance of a portion of the black metal oxide layer serving as the first protective layer is greater than a light transmittance of a portion of the black metal oxide layer serving as the anti-reflection layer.

In an embodiment of the present disclosure, the array substrate further includes: a second protective layer between the reflective electrode layer and the substrate.

In an embodiment of the present disclosure, the second protective layer is made of indium tin oxide.

In an embodiment of the present disclosure, the array substrate further includes: a third protective layer between the reflective electrode layer and the anti-reflection layer. The orthographic projection of the reflective electrode layer on the substrate is within an orthographic projection of the third protective layer on the substrate.

In another aspect, the present disclosure also provides a method for fabricating an array substrate, including:
forming a reflective electrode layer on a substrate;
forming an anti-reflection layer and a pixel defining layer on a side of the reflective electrode layer away from the substrate, wherein the anti-reflection layer is configured to absorb light from outside and is formed between the reflective electrode layer and the pixel defining layer; an orthographic projection of the reflective electrode layer on the substrate overlaps with an orthographic projection of the pixel defining layer on the substrate; an orthographic projection of the anti-reflection layer on the substrate is within an overlapping portion between the orthographic projection of the reflective electrode layer on the substrate and the orthographic projection of the pixel defining layer on the substrate; and
forming a black matrix on a side of the pixel defining layer away from the substrate, wherein an orthographic projection of at least a portion of the anti-reflection layer on the substrate does not overlap with an orthographic projection of the black matrix on the substrate.

In an embodiment of the present disclosure, forming the anti-reflection layer and the pixel defining layer on the side of the reflective electrode layer away from the substrate includes:

forming an anti-reflection material layer on the side of the reflective electrode layer away from the substrate;

forming the pixel defining layer on a side of the anti-reflection material layer away from the substrate; and processing the anti-reflection material layer by using the pixel defining layer as a mask to form the anti-reflection layer.

In an embodiment of the present disclosure, processing the anti-reflection material layer by using the pixel defining layer as the mask to form the anti-reflection layer includes:

etching the anti-reflection material layer by using the pixel defining layer as the mask to remove a portion of the anti-reflection material layer exposed by the pixel defining layer.

In an embodiment of the present disclosure, processing the anti-reflection material layer by using the pixel defining layer as the mask to form the anti-reflection layer includes:

modifying the anti-reflection material layer by using the pixel defining layer as the mask to make a portion of the anti-reflection material layer exposed by the pixel defining layer become light-transmissive.

In an embodiment of the present disclosure, a material of the anti-reflection layer includes a black metal oxide.

In an embodiment of the present disclosure, the method further includes:

forming a light emitting layer on a side of the reflective electrode layer and the pixel defining layer away from the substrate; and forming a transparent electrode layer on a side of the light emitting layer away from the substrate, wherein a light transmittance of the transparent electrode layer ranges from 40% to 60%.

In another aspect, the present disclosure also provides a display panel including the array substrate according to the present disclosure.

BRIEF DESCRIPTION OF DRAWINGS

The accompanying drawings, which are included to provide a further understanding of the present disclosure and constitute a part of this specification, serve to explain the present disclosure together with the following embodiments, but do not constitute a limitation of the present disclosure. In the drawings.

DETAIL DESCRIPTION OF EMBODIMENTS

In order that those skilled in the art will better understand the technical solutions of the present disclosure, the following detailed description is given with reference to the accompanying drawings and the specific embodiments.

In the present disclosure, the "patterning process" refers to a step of forming a structure having a specific pattern, which may be a photolithography process including one or more steps of forming a material layer, coating a photoresist, exposing, developing, etching, stripping the photoresist, and the like; of course, the "patterning process" may also be an imprinting process, an inkjet printing process, or other processes.

As used herein, a subpixel region refers to a light emitting region of a subpixel, such as a region corresponding to a light emitting layer in an organic light emitting diode display. A pixel may include several separate light emitting regions corresponding to several subpixels in the pixel. For example, the subpixel region is a light emitting region of a red subpixel. For example, the subpixel region is a light emitting region of a green subpixel. For example, the subpixel region is a light emitting region of a blue subpixel. For example, the subpixel region is a light emitting region of a white subpixel.

As used herein, an inter-subpixel region refers to a region between adjacent subpixel regions, such as a region corresponding to a pixel defining layer in an organic light emitting diode display. For example, the inter-subpixel region is a region between adjacent subpixel regions in the same pixel. For example, the inter-subpixel region is a region between two adjacent subpixel regions from two adjacent pixels. For example, the inter-subpixel region is a region between a subpixel region of a red subpixel and a subpixel region of a green subpixel adjacent to the red subpixel. For example, the inter-subpixel region is a region between a subpixel region of a red subpixel and a subpixel region of a blue subpixel adjacent to the red subpixel. For example, the inter-subpixel region is a region between a subpixel region of a green subpixel and a subpixel region of a blue subpixel adjacent to the green subpixel.

The present disclosure will be described in more detail below with reference to the accompanying drawings. Like elements are denoted by like reference numerals throughout the various drawings. For purposes of clarity, the various features in the drawings are not drawn to scale. Moreover, certain well-known elements may not be shown in the drawings.

Numerous specific details of the present disclosure, such as structures, materials, dimensions, processes and techniques of the components, are set forth in the following description in order to provide a more thorough understanding of the present disclosure. However, as will be understood by those skilled in the art, the present disclosure may be practiced without these specific details.

Figure 1:
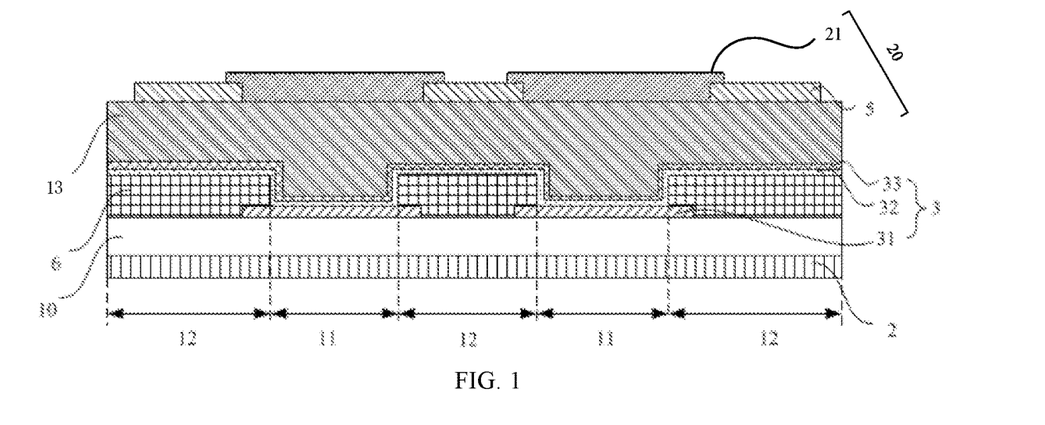
FIG. 1 is a schematic structural diagram of a display panel.

FIG. 1 is a schematic structural diagram of a display panel. The display panel has a plurality of subpixel regions 11 and an inter-subpixel region 12 between the plurality of subpixel regions 11. The display panel includes: a substrate 2; a display structure 3 and a pixel defining layer 6 on the substrate 2; an encapsulation layer 13 on a side of the display structure 3 and the pixel defining layer 6 away from the substrate 2; and a color filter layer 20 on a side of the encapsulation layer 13 away from the substrate 2. The display structure 3 includes a reflective electrode layer 31, a light emitting layer 32, and a transparent electrode layer 33. The reflective electrode layer 31 extends from the subpixel region 11 to the inter-subpixel region 12. The pixel defining layer 6 defines the plurality of subpixel regions 11. The color filter layer 20 includes a black matrix 5 and color filters 21 located in areas defined by the black matrix 5. As shown in FIG. 1, in order to ensure the light extraction efficiency of the subpixel region 11, the black matrix 5 does not completely cover the inter-subpixel region 12, i.e., there is a small interval between the black matrix 5 and the adjacent subpixel region 11 when viewed in a plan view. When the external ambient light is incident onto the display panel, the black matrix can prevent the external ambient light incident onto the black matrix from being reflected. However, the external ambient light is reflected in the spacer region between the black matrix and the subpixel region 11, which makes the display panel have high reflectivity to the external ambient light, thereby affecting the display effect.

Therefore, the present disclosure particularly provides an array substrate having a novel structure, a method of fabricating the same, and a display panel. In one aspect, the present disclosure provides an array substrate, including: a substrate; a reflective electrode layer on the substrate; a pixel defining layer on a side of the reflective electrode layer away from the substrate, an orthographic projection of the reflective electrode layer on the substrate overlapping with an orthographic projection of the pixel defining layer on the substrate; an anti-reflection layer located between the reflective electrode layer and the pixel defining layer, and configured to absorb light from outside, an orthographic projection of the anti-reflection layer on the substrate being within an overlapping portion between the orthographic projection of the reflective electrode layer on the substrate and the orthographic projection of the pixel defining layer on the substrate; and a black matrix on a side of the pixel defining layer away from the substrate, an orthographic projection of at least a portion of the anti-reflection layer on the substrate not overlapping with an orthographic projection of the black matrix on the substrate.

Figure 2:
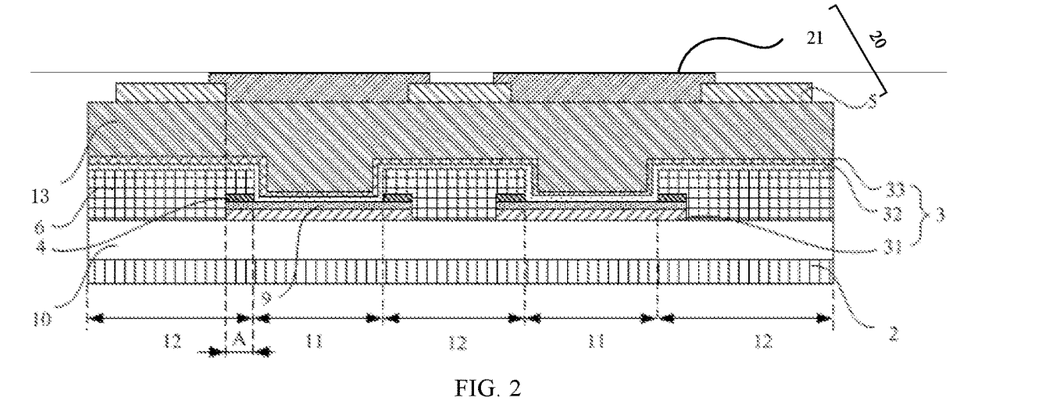
FIG. 2 is a schematic structural diagram of an array substrate according to an embodiment of the present disclosure.
Figure 3:
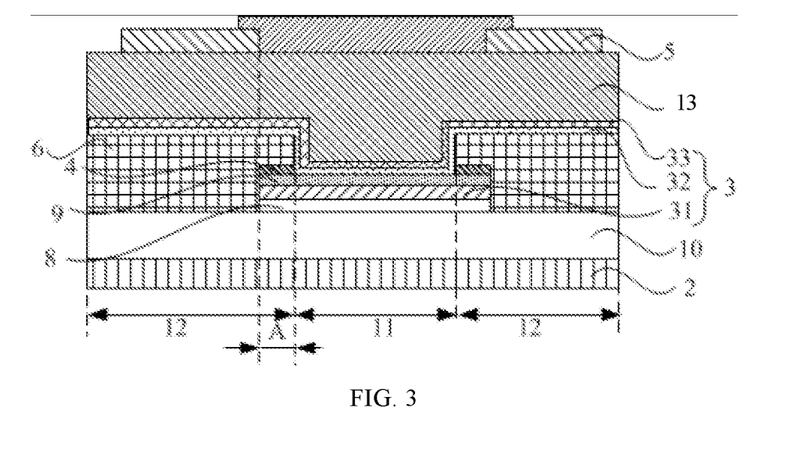
FIG. 3 is a schematic diagram of a partial structure of an array substrate according to an embodiment of the present disclosure.

As shown in FIGS. 2 and 3, an embodiment of the present disclosure provides an array substrate having a plurality of subpixel regions 11 and an inter-subpixel region 12 located between the plurality of subpixel regions 11. The array substrate includes: a substrate 2; a reflective electrode layer 31 on the substrate 2; a pixel defining layer 6 located on a side of the reflective electrode layer 31 away from the substrate 2; an anti-reflection layer 4 located between the reflective electrode layer 31 and the pixel defining layer 6, and configured to absorb light from outside; and a black matrix 5 on a side of the pixel defining layer 6 away from the substrate 2.

In the embodiment of the present disclosure, an orthographic projection of the reflective electrode layer 31 on the substrate 2 overlaps with an orthographic projection of the pixel defining layer 6 on the substrate 2. As shown in FIGS. 2 and 3, the reflective electrode layer 31 extends from the subpixel region 11 to the inter-subpixel region 12.

In the embodiment of the present disclosure, an orthographic projection of the anti-reflection layer 4 on the substrate 2 is located within an overlapping portion between the orthographic projection of the reflective electrode layer 31 on the substrate 2 and the orthographic projection of the pixel defining layer 6 on the substrate 2; an orthographic projection of at least a portion of the anti-reflection layer 4 on the substrate 2 does not overlap with an orthographic projection of the black matrix 5 on the substrate 2. As shown in FIGS. 2 and 3, the anti-reflection layer 4 is located in an overlapping region between the reflective electrode layer 31 and the pixel defining layer 6, and the anti-reflection layer 4 is at least partially distributed in a spacer region between the black matrix 5 and the subpixel region 11.

In the array substrate according to the embodiment of the present disclosure, the anti-reflection layer 4 is arranged in an area of the inter-subpixel region 12 not shielded by the black matrix 5, so that ambient light emitted from external environment to the area of the inter-subpixel region 12 not shielded by the black matrix 5 can be absorbed to avoid the ambient light from being reflected in the area of the inter-subpixel region 12 not shielded by the black matrix 5, and further, the display performance of the array substrate is ensured and the user experience is improved.

In the embodiment of the present disclosure, the array substrate includes a display structure 3 configured to emit light toward a side away from the substrate 2. The display structure 3 includes a reflective electrode layer 31. The display structure 3 is configured to emit light for producing a display image from the subpixel region 11, i.e., the display image is visible to a user from the subpixel region 11. The anti-reflection layer 4 located in the inter-subpixel region 12 may absorb the ambient light emitted from the external environment to the inter-subpixel region 12 to prevent the ambient light from being reflected in the inter-subpixel region 12.

In the embodiment of the present disclosure, there is an interval (as shown by "A" in FIGS. 2 and 3) between the black matrix 5 and the subpixel region 11; the anti-reflection layer 4 is closer to the subpixel region 11 than the black matrix 5, and the orthographic projection of the anti-reflection layer 4 on the substrate 2 adjoins or partially overlaps with the orthographic projection of the black matrix 5 on the substrate 2.

In the present disclosure, the black matrix 5 located in the inter-subpixel region 12 can absorb light emitted from the display structure 3 and directed thereto, thereby avoiding problems such as crosstalk between adjacent subpixels. Meanwhile, the black matrix 5 is disposed to avoid the reflection of ambient light in the corresponding area of the inter-subpixel region 12 where the black matrix 5 is located.

The anti-reflection layer 4 being closer to the subpixel region 11 than the black matrix 5 means that at least a portion of the anti-reflection layer 4 is located in a spacer region between the black matrix 5 and the subpixel region 11 to avoid reflection of ambient light in this spacer region; the fact that the orthographic projection of the anti-reflection layer 4 on the substrate 2 adjoins or partially overlaps with the orthographic projection of the black matrix 5 on the substrate 2 means that the anti-reflection layer 4 and the black matrix 5 may adjoin each other or have an overlapping portion in a direction parallel to the substrate 2, which can ensure that the region between the black matrix 5 and the subpixel region 11 can absorb ambient light to avoid reflection of ambient light.

Compared with the display panel shown in FIG. 1, in the array substrate according to the embodiment of the present disclosure, as shown in FIG. 2, by providing the anti-reflection layer 4 in the region between the black matrix 5 and the subpixel region 11, ambient light can be prevented from being reflected in the region, and the display effect of the array substrate can be further improved.

In some embodiments, an orthographic projection of at least one edge of the anti-reflection layer 4 on the substrate 2 coincides with an orthographic projection of an edge of the pixel defining layer 6 on the substrate 2. The at least one edge of the anti-reflection layer 4 is disposed along a boundary between the subpixel region 11 and the inter-subpixel region 12.

In some embodiments, the anti-reflection layer 4 may completely cover a gap between the black matrix 5 and the subpixel region 11, so as to ensure that the entire inter-subpixel region 12 can absorb ambient light, thereby preventing the ambient light from being reflected in the inter-subpixel region 12, and further improving the display performance of the array substrate.

In the present disclosure, a major portion of the reflective electrode layer 31 is located in the subpixel region 11, and at least a portion of an edge thereof extends into the inter-subpixel region 12, and the anti-reflection layer 4 is disposed just above the portion of the reflective electrode layer 31 extending into the inter-subpixel region 12.

In some embodiments, a material of the anti-reflection layer 4 includes a black metal oxide, and a material of the reflective electrode layer 31 includes any one of silver or aluminum. It should be noted that the anti-reflection layer 4 may be formed of other suitable materials, which are not limited to the black metal oxide, and may be determined according to actual conditions. The black metal oxide may be tungsten oxide ($WO_x$) or molybdenum oxide ($MoO_x$).

The anti-reflection layer 4 is located on the reflective electrode layer 31, and the destructive interference of light between the two layers may effectively reduce the reflectivity, and the reflectivity for ambient light can be reduced to below 5%.

In the present disclosure, the pixel defining layer 6 defines the subpixel regions 11, i.e., an edge of the pixel defining layer 6 close to the subpixel region 11 coincides with the boundary between the subpixel region 11 and the inter-subpixel region 12, and in this case, the portion of the reflective electrode layer 31 located in the inter-subpixel region 12 is covered by the pixel defining layer 6.

The anti-reflection layer 4 is located between the pixel defining layer 6 and the reflective electrode layer 31. It should be noted that the anti-reflection layer 4 is formed by using the pixel defining layer 6 as a mask in the process of forming the anti-reflection layer 4, so that the process of forming the anti-reflection layer 4 can be simplified, thereby reducing the fabrication cost.

The pixel defining layer 6 may be an organic resin film layer, and for example, may be formed of polyimide-based material, silicon-based resin, polyacrylic resin, or the like.

It should be noted that a black pixel defining layer 6 is employed in the display panel in the related art to avoid reflection of ambient light between the black matrix 5 and the subpixel region 11. However, the black pixel defining layer 6 itself has a small optical transmittance (OD), and thus its anti-reflection effect is poor.

In an embodiment of the present disclosure, the display structure 3 further includes: a light emitting layer 32 on a side of the reflective electrode layer 31 and the pixel defining layer 6 away from the substrate 2; and a transparent electrode layer 33 on a side of the light emitting layer 32 away from the substrate 2.

In this embodiment, the array substrate is an array substrate of an organic light emitting diode display, the reflective electrode layer 31 serves as an anode of the display structure 3, the transparent electrode layer 33 serves as a cathode of the display structure 3, and the reflective electrode layer 31 and the transparent electrode layer 33 jointly drive the light emitting layer 32 to emit light, so that the emitted light is directed to a side away from the substrate 2, thereby forming a display image.

It should be noted that the light emitted from the light emitting layer 32 to the reflective electrode layer 31 may be reflected by the reflective electrode layer 31, so that the light can finally exit from the light-exiting surface of the array substrate (i.e. the transparent electrode layer side), thereby greatly improving the light extraction efficiency of the array substrate.

In the embodiment of the present disclosure, the array substrate further includes an encapsulation layer 13 and a color filter layer 20, the encapsulation layer 13 is located on a side of the display structure 3 away from the substrate 2, and the color filter layer 20 is located on a side of the encapsulation layer 13 away from the substrate 2. The color filter layer 20 includes the black matrix 5 and color filters 21 located in areas defined by the black matrix 5. The encapsulation layer 13 is configured to encapsulate the display structure 3 to protect the display structure 3.

In an embodiment of the present disclosure, the array substrate further includes: a first protective layer 7 between the reflective electrode layer 31 and the light emitting layer 32.

Since the metal (e.g., silver) as the reflective electrode layer 31 is easily oxidized, the first protective layer 7 needs to be disposed on the surface of the reflective electrode layer 31 to slow down the oxidation rate of the reflective metal, thereby improving the service life of the array substrate.

Figure 5:
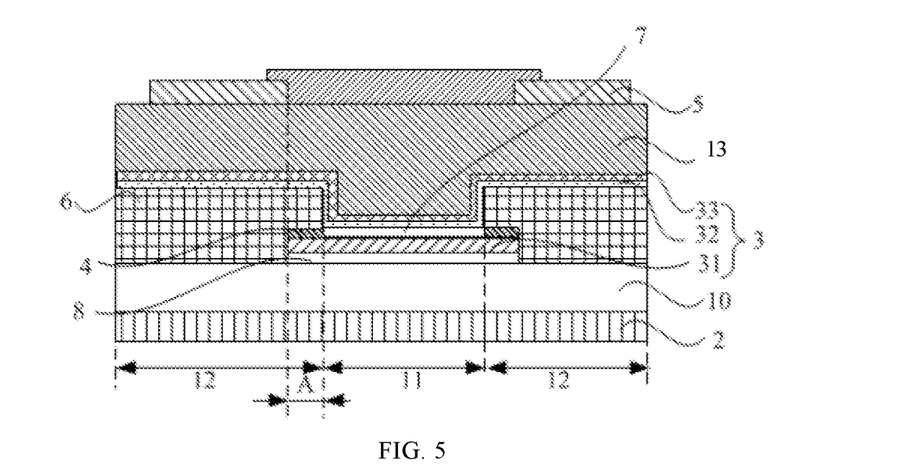
FIG. 5 is a schematic diagram of a partial structure of an array substrate according to an embodiment of the present disclosure.

Note that the first protective layer 7 located between the reflective electrode layer 31 and the light emitting layer 32 may be provided in the same layer as the anti-reflection layer 4. For example, a black metal oxide layer is first formed on the reflective electrode layer 31; next, the pixel defining layer 6 defining the subpixel regions 11 is formed; then, by using the pixel defining layer 6 as a mask, a transparentizing process (e.g., an oxygen plasma process) is performed on the black metal oxide layer so that a portion of the black metal oxide layer located in the subpixel region 11 becomes light-transmissive, thereby forming the first protective layer 7, and a portion of the black metal oxide layer located between the pixel defining layer 6 and the reflective electrode layer 31 is formed as the anti-reflection layer 4. After the oxygen plasma process, the transmittance of the portion of the black metal oxide layer in the subpixel region 11 can be increased to 90%; and the work function thereof also meets the work function requirement of the anode, and the array substrate is formed as shown in FIG. 5.

As another example, the anti-reflection material layer 41 is first formed on the reflective electrode layer 31; next, the pixel defining layer 6 defining the subpixel region 11 is formed; then, the anti-reflection material layer 41 is etched by using the pixel defining layer 6 as a mask to remove the portion of the anti-reflection material layer 41 located in the subpixel region 11. In this case, the array substrate is formed without the first protective layer 7 between the light emitting layer 32 and the reflective electrode layer 31. However, it should be noted that, in this case, in order to avoid damage (such as oxidation) to the reflective electrode layer 31 during etching, it is necessary to form a third protective layer 9 on the reflective electrode layer 31 after forming the reflective electrode layer 31, and then form the anti-reflection material layer 41 on the third protective layer 9, and the array substrate is formed as shown in FIG. 3. In some embodiments, the orthographic projection of the reflective electrode layer 31 on the substrate 2 is within an orthographic projection of the third protective layer 9 on the substrate 2. In some embodiments, the material of the third protective layer 9 may be indium tin oxide (ITO).

In an embodiment of the present disclosure, the array substrate further includes: a second protective layer 8 between the reflective electrode layer 31 and the substrate 2.

Since the metal (e.g., silver) as the reflective electrode layer 31 is easily oxidized, the second protective layer 8 needs to be disposed on the lower surface of the reflective electrode layer 31 (i.e., between the reflective electrode layer 31 and the substrate 2) to slow down the oxidation rate of the reflective metal, thereby prolonging the service life of the array substrate. In some embodiments, the material of the second protective layer 8 may be indium tin oxide (ITO).

In addition, the array substrate further includes a transistor structure 10. The transistor structure 10 is located between the display structure 3 and the substrate 2 and configured to supply power to the reflective electrode layer 31 and the transparent electrode layer 33.

In another aspect, the present disclosure also provides a method for fabricating an array substrate, the array substrate has a plurality of subpixel regions 11 and an inter-subpixel region 12 located between the plurality of subpixel regions 11. The method comprises the following steps of:

forming a reflective electrode layer 31 on a substrate 2;

forming an anti-reflection layer 4 and a pixel defining layer 6 on a side of the reflective electrode layer 31 away from the substrate 2, wherein the anti-reflection layer 4 is configured to absorb light from the outside and located between the reflective electrode layer 31 and the pixel defining layer 6; an orthographic projection of the reflective electrode layer 31 on the substrate 2 overlaps with an orthographic projection of the pixel defining layer 6 on the substrate 2; an orthographic projection of the anti-reflection layer 4 on the substrate 2 is located within an overlapping portion between the orthographic projection of the reflective electrode layer 31 on the substrate and the orthographic projection of the pixel defining layer 6 on the substrate 2; and forming a black matrix on a side of the pixel defining layer 6 away from the substrate 2, wherein an orthographic projection of at least a portion of the anti-reflection layer 4 on the substrate 2 does not overlap with an orthographic projection of the black matrix 5 on the substrate 2.

In the array substrate according to the embodiment of the present disclosure, the anti-reflection layer 4 is arranged in the area of the inter-subpixel region 12 not shielded by the black matrix 5, so that ambient light emitted from external environment to the area of the inter-subpixel region 12 not shielded by the black matrix 5 can be absorbed to avoid ambient light from being reflected in the area of the inter-subpixel region 12 not shielded by the black matrix 5, and further, the display performance of the array substrate is ensured and the user experience is improved.

Figure 7:
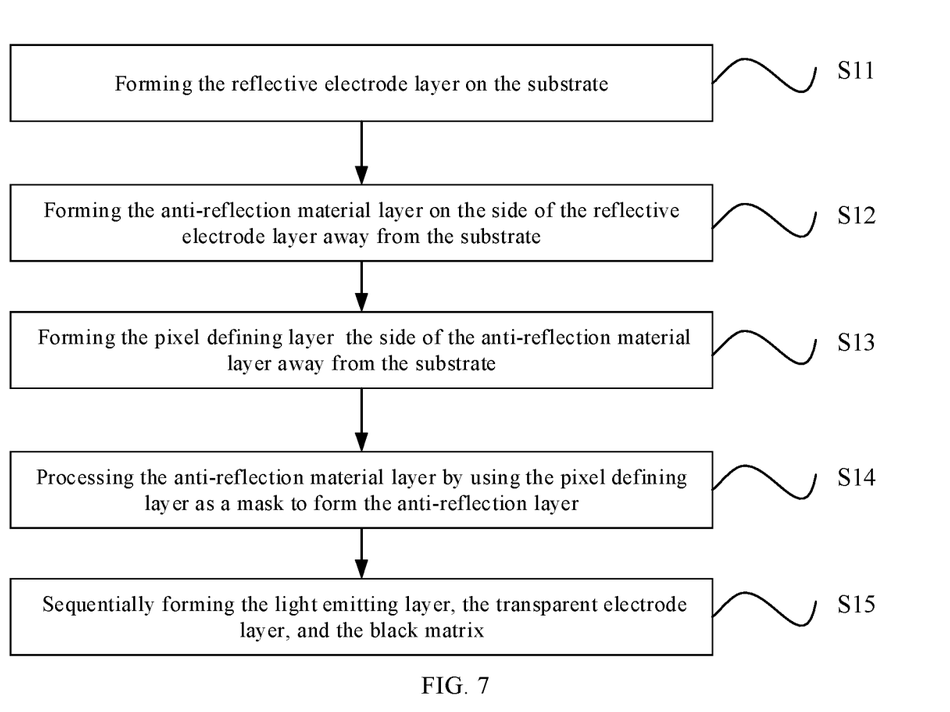
FIG. 7 is a schematic flow chart illustrating a method for fabricating an array substrate according to an embodiment of the present disclosure.

FIG. 7 is a schematic flow chart illustrating a method for fabricating an array substrate according to an embodiment of the present disclosure. The method for fabricating the array substrate includes steps S11 to S15.

Figure 4A:
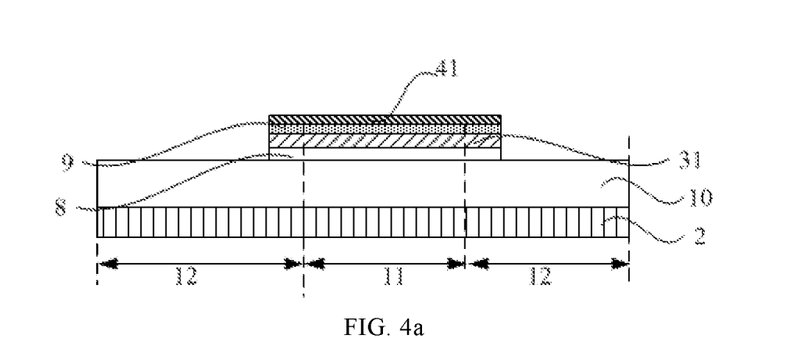
FIGS. 4a to 4d are schematic structural diagrams illustrating steps in a method for fabricating a structure of the array substrate shown in FIG. 3.

In step S11, as shown in FIG. 4a, the reflective electrode layer 31 is formed on the substrate 2.

The major portion of the reflective electrode layer is located in the subpixel region 11, and at least a portion of an edge thereof extends into the inter-subpixel region 12.

In an embodiment of the present disclosure, the second protective layer 8 may be formed on the substrate 2 before the reflective electrode layer 31 is formed.

In step S12, as shown in FIG. 4a, the anti-reflection material layer 41 is formed on the side of the reflective electrode layer 31 away from the substrate 2.

The anti-reflection material layer 41 completely covers the reflective electrode layer 31.

Figure 4B:
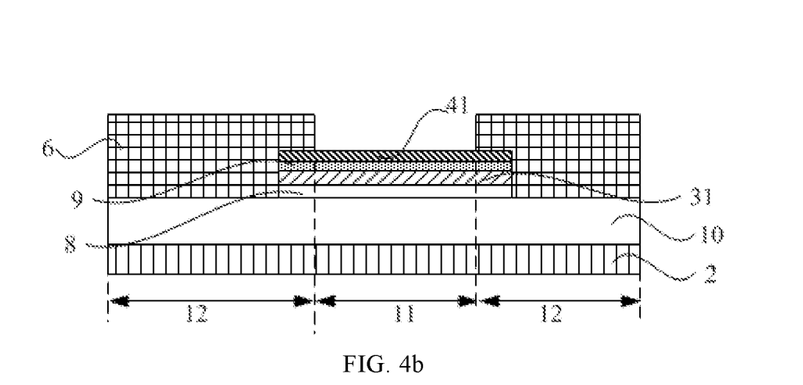

In step S13, as shown in FIG. 4b, the pixel defining layer 6 is formed on the side of the anti-reflection material layer 41 away from the substrate 2, and configured to define the subpixel regions 11.

The edge of the pixel defining layer 6 close to the subpixel region 11 coincides with the boundary between the subpixel region 11 and the inter-subpixel region 12, and in this case, the portion of the reflective electrode layer 31 located in the inter-subpixel region 12 is covered by the pixel defining layer 6.

Figure 4C:
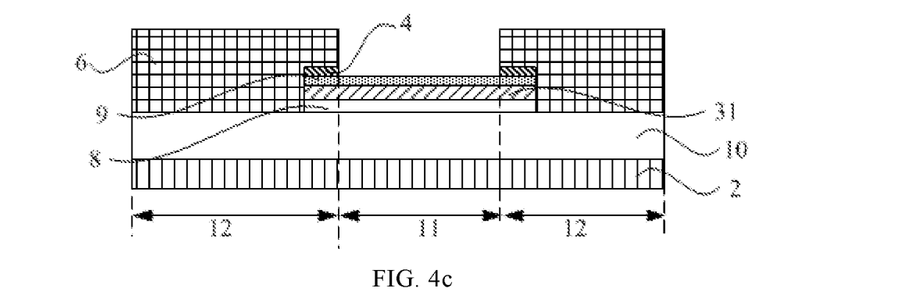

In step S14, as shown in FIG. 4c, the anti-reflection material layer 41 is processed by using the pixel defining layer 6 as a mask to form the anti-reflection layer 4.

In the embodiment of the present disclosure, processing the anti-reflection material layer 41 by using the pixel defining layer 6 as a mask includes: as shown in FIG. 4c, etching the anti-reflection material layer 41 by using the pixel defining layer 6 as a mask to remove the portion of the anti-reflection material layer 41 located in the subpixel region 11.

After the anti-reflection material layer 41 is etched by using the pixel defining layer 6 as a mask, the anti-reflection material layer 41 remaining between the pixel defining layer 6 and the reflective electrode layer 31 is the anti-reflection layer 4. Therefore, for this case, the first protective layer 7 is not provided between the light emitting layer 32 and the reflective electrode layer 31 in the array substrate formed later.

The etching method may include wet etching and dry etching. In wet etching, ferric trichloride solution ($FeCl_3$), nitric acid solution ($HNO_3$) and peroxyacetyl nitrate solution (PAN) may be adopted as the etching solution; in dry etching, sulfur hexafluoride gas ($SF_6$), carbon tetrafluoride gas ($CF_4$) and the like may be selected as the dry etching gas.

It should be noted that, in this case, in order to avoid damage (such as oxidation) to the reflective electrode layer 31 during etching, it is necessary to form the third protective layer 9 on the reflective electrode layer 31 after the reflective electrode layer 31 is formed, and then form the anti-reflection material layer 41 on the third protective layer 9, and the array substrate is formed as shown in FIG. 3.

Figure 6:
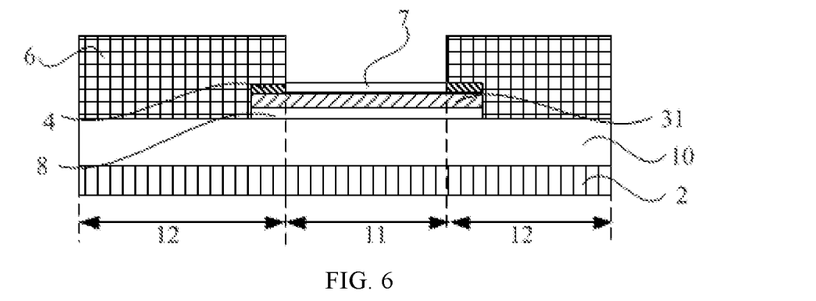
FIG. 6 is a schematic structural diagram illustrating a step in a method for fabricating a structure of the array substrate shown in FIG. 5.

In another embodiment of the present disclosure, processing the anti-reflection material layer 41 by using the pixel defining layer 6 as a mask includes: as shown in FIG. 6, modifying the anti-reflection material layer 41 by using the pixel defining layer 6 as a mask to make the portion of the anti-reflection material layer 41 located in the subpixel region 11 become light transmissive.

After the anti-reflection material layer 41 is modified by using the pixel defining layer 6 as a mask, the portion of the anti-reflection material layer 41 between the reflective electrode layer 31 and the light emitting layer 32 becomes light transmissive, thereby forming the first protective layer 7; and the remaining portion of the anti-reflection material layer 41 positioned between the pixel defining layer 6 and the reflective electrode layer 31 serves as the anti-reflection layer 4. Therefore, for this case, the first protective layer 7 is provided between the light emitting layer 32 and the reflective electrode layer 31 in the array substrate formed later. In some embodiments, the modification process is an oxygen plasma process, and after the oxygen plasma process, the transmittance of the black metal oxide layer in the subpixel region 11 can be increased to 90%; and its work function also meets the work function requirements of the anode.

It should be noted that, in this case, since the oxygen plasma process has little damage to the reflective electrode layer 31, the third protective layer 9 may not be formed on the reflective electrode layer 31, and the array substrate may be formed as shown in FIG. 5.

Figure 4D:
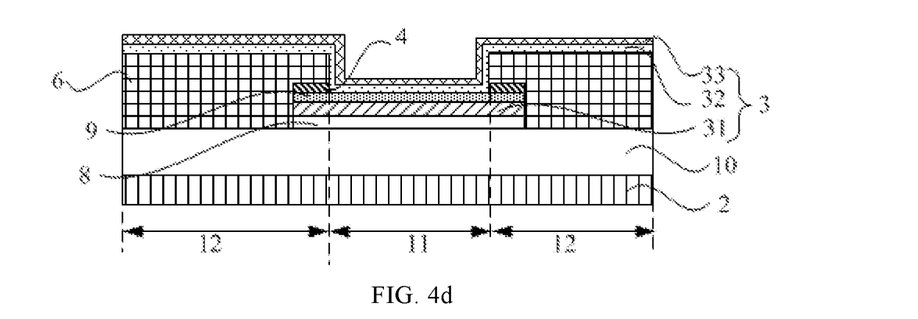

In step S15, as shown in FIG. 4d, the light emitting layer 32, the transparent electrode layer 33, and the black matrix 5 are sequentially formed. The light transmittance of the transparent electrode layer 33 ranges from 40% to 60%.

The black matrix 5 and the subpixel region 11 have an interval therebetween; the anti-reflection layer 4 is closer to the subpixel region 11 than the black matrix 5, and the orthographic projection of the anti-reflection layer 4 on the substrate 2 adjoins or partially overlaps with the orthographic projection of the black matrix 5 on the substrate 2. The anti-reflection layer 4 being closer to the subpixel region 11 than the black matrix 5 means that at least a portion of the anti-reflection layer 4 is located in a spacer region between the black matrix 5 and the subpixel region 11 to avoid reflection of ambient light in this spacer region; the fact that the orthographic projection of the anti-reflection layer 4 on the substrate 2 adjoins or partially overlaps with the orthographic projection of the black matrix 5 on the substrate 2 means that the anti-reflection layer 4 and the black matrix 5 may adjoin each other or have an overlapping portion in a direction parallel to the substrate 2, which can ensure that the region between the black matrix 5 and the subpixel region 11 can absorb ambient light to avoid reflection of ambient light.

In the array substrate according to the embodiment of the present disclosure, by disposing the anti-reflection layer 4 in the region between the black matrix 5 and the subpixel region 11, ambient light can be prevented from being reflected in the region, and the display effect of the array substrate can be further improved.

In another aspect, the present disclosure provides a display panel including the array substrate described above.

In the embodiments of the present disclosure, the display panel may be any product or component having a display function, such as an organic light emitting diode (OLED) display panel, an electronic paper, a mobile phone, a tablet computer, a display, a television, a notebook computer, a digital photo frame, and a navigator.

It should be noted that, relational terms such as first, second, and the like are used solely to distinguish one entity or action from another entity or action without necessarily requiring or implying any actual such relationship or order between such entities or actions. Also, the terms "include", "comprise", and any other variation thereof, are intended to cover a non-exclusive inclusion, such that a process, method, article, or apparatus that includes a list of elements does not include only those elements but may include other elements not expressly listed or inherent to such process, method, article, or apparatus. Without further limitation, an element defined by the phrase "including an . . . " does not exclude the presence of other identical elements in the process, method, article, or apparatus that includes the element.

The embodiments according to the present disclosure are described above, and these embodiments are not intended to be exhaustive or to limit the disclosure to the specific embodiments. Obviously, many modifications and variations are possible in light of the above description. The embodiments are chosen and described in order to better explain the principles and the practical applications of the present disclosure, to thereby enable those skilled in the art to utilize the present disclosure and various embodiments with various modifications as are suited to the particular use contemplated. The present disclosure is to be limited only by the claims and their full scope and equivalents.

What is claimed is:

1. An array substrate, comprising:
   a substrate;
   a reflective electrode layer on the substrate;
   a pixel defining layer on a side of the reflective electrode layer away from the substrate, wherein an orthographic projection of the reflective electrode layer on the substrate overlaps with an orthographic projection of the pixel defining layer on the substrate;
   an anti-reflection layer between the reflective electrode layer and the pixel defining layer, and configured to absorb light from outside, wherein an orthographic projection of the anti-reflection layer on the substrate is within an overlapping portion between the orthographic projection of the reflective electrode layer on the substrate and the orthographic projection of the pixel defining layer on the substrate;
   a black matrix on a side of the pixel defining layer away from the substrate, wherein an orthographic projection of at least a portion of the anti-reflection layer on the substrate does not overlap with an orthographic projection of the black matrix on the substrate; and
   a first protective layer on the side of the reflective electrode layer away from the substrate, wherein the first protective layer and the anti-reflection layer are formed from a same black metal oxide layer, and a light transmittance of a portion of the black metal oxide layer serving as the first protective layer is greater than a light transmittance of a portion of the black metal oxide layer serving as the anti-reflection layer.

2. The array substrate of claim 1, wherein the orthographic projection of the anti-reflection layer on the substrate adjoins the orthographic projection of the black matrix on the substrate.

3. The array substrate of claim 1, wherein the orthographic projection of the anti-reflection layer on the substrate partially overlaps with the orthographic projection of the black matrix on the substrate.

4. The array substrate of claim 1, wherein an orthographic projection of at least one edge of the anti-reflection layer on the substrate coincides with an orthographic projection of an edge of the pixel defining layer on the substrate.

5. The array substrate of claim 1, wherein a material of the anti-reflection layer comprises a black metal oxide.

6. The array substrate of claim 5, wherein the black metal oxide is tungsten oxide ($WO_x$) or molybdenum oxide ($MoO_x$).

7. The array substrate of claim 5, wherein a material of the reflective electrode layer comprises any one of silver or aluminum.

8. The array substrate of claim 1, further comprising a display structure and a color filter layer on a side of the display structure away from the substrate, wherein
   the display structure comprises:
   the reflective electrode layer;
   a light emitting layer on a side of the reflective electrode layer and the pixel defining layer away from the substrate; and
   a transparent electrode layer on a side of the light emitting layer away from the substrate, and the color filter layer comprises:
: the black matrix; and
: a color filter in an area defined by the black matrix.

9. The array substrate of claim 8, wherein the first protective layer is between the reflective electrode layer and the light emitting layer.

10. The array substrate of claim 1, further comprising: a second protective layer between the reflective electrode layer and the substrate.

11. The array substrate of claim 10, wherein the second protective layer is made of indium tin oxide.

12. The array substrate of claim 1, further comprising: a third protective layer between the reflective electrode layer and the anti-reflection layer, wherein the orthographic projection of the reflective electrode layer on the substrate is within an orthographic projection of the third protective layer on the substrate.

13. A display panel, comprising the array substrate of claim 1.

14. A method for fabricating an array substrate, comprising:
: forming a reflective electrode layer on a substrate;
: forming an anti-reflection layer and a pixel defining layer on a side of the reflective electrode layer away from the substrate, wherein the anti-reflection layer is configured to absorb light from outside and is formed between the reflective electrode layer and the pixel defining layer; an orthographic projection of the reflective electrode layer on the substrate overlaps with an orthographic projection of the pixel defining layer on the substrate; an orthographic projection of the anti-reflection layer on the substrate is within an overlapping portion between the orthographic projection of the reflective electrode layer on the substrate and the orthographic projection of the pixel defining layer on the substrate; and
: forming a black matrix on a side of the pixel defining layer away from the substrate, wherein an orthographic projection of at least a portion of the anti-reflection layer on the substrate does not overlap with an orthographic projection of the black matrix on the substrate,
: wherein the method further comprises forming a first protective layer on the side of the reflective electrode layer away from the substrate, wherein the first protective layer and the anti-reflection layer are formed from a same black metal oxide layer, and a light transmittance of a portion of the black metal oxide layer serving as the first protective layer is greater than a light transmittance of a portion of the black metal oxide layer serving as the anti-reflection layer.

15. The method of claim 14, wherein forming the anti-reflection layer and the pixel defining layer on the side of the reflective electrode layer away from the substrate comprises:
: forming an anti-reflection material layer on the side of the reflective electrode layer away from the substrate;
: forming the pixel defining layer on a side of the anti-reflection material layer away from the substrate; and
: processing the anti-reflection material layer by using the pixel defining layer as a mask to form the anti-reflection layer.

16. The method of claim 15, wherein processing the anti-reflection material layer by using the pixel defining layer as the mask to form the anti-reflection layer comprises:
: etching the anti-reflection material layer by using the pixel defining layer as the mask to remove a portion of the anti-reflection material layer exposed by the pixel defining layer.

17. The method of claim 15, wherein processing the anti-reflection material layer by using the pixel defining layer as the mask to form the anti-reflection layer comprises:
: modifying the anti-reflection material layer by using the pixel defining layer as the mask to make a portion of the anti-reflection material layer exposed by the pixel defining layer become light-transmissive.

18. The method of claim 14, wherein a material of the anti-reflection layer comprises a black metal oxide.

19. The method of claim 14, further comprising:
: forming a light emitting layer on a side of the reflective electrode layer and the pixel defining layer away from the substrate; and
: forming a transparent electrode layer on a side of the light emitting layer away from the substrate, wherein a light transmittance of the transparent electrode layer ranges from 40% to 60%.

* * * * *